(12) United States Patent
Tsukahara

(10) Patent No.: US 10,116,273 B2
(45) Date of Patent: Oct. 30, 2018

(54) CURRENT REUSE FIELD EFFECT TRANSISTOR AMPLIFIER

(71) Applicant: Mitsubishi Electric Corporation, Tokyo (JP)

(72) Inventor: Yoshihiro Tsukahara, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 15/361,173

(22) Filed: Nov. 25, 2016

(65) Prior Publication Data

US 2017/0288620 A1 Oct. 5, 2017

(30) Foreign Application Priority Data

Mar. 29, 2016 (JP) ................. 2016-065718

(51) Int. Cl.
  *H03F 3/04* (2006.01)
  *H03F 3/16* (2006.01)
  *H03F 3/193* (2006.01)
  *H03F 1/02* (2006.01)

(52) U.S. Cl.
  CPC .......... *H03F 3/193* (2013.01); *H03F 1/0211* (2013.01); *H03F 2200/21* (2013.01); *H03F 2200/451* (2013.01)

(58) Field of Classification Search
  CPC ............. H03F 1/301; H03F 1/302; H03F 3/04
  USPC ........................................ 330/296, 277, 285
  See application file for complete search history.

(56) References Cited

U.S. PATENT DOCUMENTS

2012/0133441 A1   5/2012 Tsukashima

FOREIGN PATENT DOCUMENTS

JP   2012-119794 A   6/2012

OTHER PUBLICATIONS

K. Yamamoto (2005) "A 1.8-V Operation 5-GHz-Band CMOS Frequency Doubler Using Current-Reuse Circuit Design Technique" IEEE Journal of Solid-State Circuits, vol. 40, No. 6, pp. 1288-1295, Jun. 2005.
K. Tsukashima et al., "E-Band Radio Link Communication Chipset in Cost Effective Wafer Level Chip Size Package (WLCSP) Technology", Proceedings of the 6th European Microwave Integrated Circuits Conference, Oct. 2011, pp. 29-32, Japan.
K. Yamamoto, "A 1.8-V Operation 5-GHz-Band CMOS Frequency Doubler Using Current-Reuse Circuit Design Technique", IEEE Journal of Solid-State Circuits, Jun. 2005, pp. 1288-1295, vol. 40, No. 6.

*Primary Examiner* — Khanh V Nguyen
*Assistant Examiner* — Khiem Nguyen
(74) *Attorney, Agent, or Firm* — Studebaker & Brackett PC

(57) ABSTRACT

A current reuse FET amplifier according to the present invention provides an effect of reducing a variation of bias current of the amplifier, with gate voltage or a resistor for self-biasing of an FET of the amplifier changing in accordance with a process variation of saturation current Idss of the FET.

7 Claims, 8 Drawing Sheets

CURRENT REUSE FIELD EFFECT TRANSISTOR AMPLIFIER

BACKGROUND OF THE INVENTION

Field of the Invention

The present invention relates to bias current control in a current reuse field effect transistor (FET) amplifier using a depletion mode FET.

Background Art

In recent years, on-vehicle radars using microwave/millimeter bands have been increasingly employed for self-driving of vehicles and alleviating impact of car crashes. Millimeter waves in a 77 GHz band are used for long range monitoring by the on-vehicle radar, due to their advantages of high linear travelling performance and relatively less attenuation in rainy weather. A circuit, in charge of power amplification and frequency conversion for a signal from such a radar, often employs a GaAs-based FET, featuring high output/high gain characteristics in a high frequency range (for example, see Japanese Patent Application Laid-open 2012-119794 (page 4 and FIG. 1) or 2011 Proc. Of the 6th European Microwave Integrate Circuits Conference, pp. 29-32, "E-Band Radio Link Communication Chipset in Cost Effective Wafer Level Chip Size Package (WLCSP) Technology" (page 31 and FIG. 9)).

An example of the power amplifier employing the GaAs-based FET is described in Japanese Patent Application Laid-open 2012-119794 and 2011 Proc. Of the 6th European Microwave Integrate Circuits Conference, pp. 29-32, "E-Band Radio Link Communication Chipset in Cost Effective Wafer Level Chip Size Package (WLCSP) Technology". It is described in these documents that the on-vehicle application limits the selectable circuit configuration to those operable with a single 5-V power supply and generally usable in vehicles. A typical example of such a circuit configuration is a current reuse circuit configuration. FIG. 13 illustrates a circuit configuration of a power reuse amplifier employing a GaAs-based FET. The circuit configuration in the figure includes: depletion mode (normally on) GaAs-based FETs (generally, a high electron mobility transistor (HEMT)) F1 and F2; resistors R1 to R3; capacitors C1 to C6; transmission lines L1 to L4 having a function similar to that of inductance; an input terminal IN for a radio frequency (RF) signal; an output terminal OUT for the RF signal; a terminal for power supply Vdd; and drain current Idd flowing in the FET F2. The capacitors C1 and C2 are used for grounding, for the RF signal. The capacitors C3 to C6 and the transmission lines L1 to L4 are for input, interstage, and output matching. The resistor R3 is for fixing a gate potential of the FET F1 to 0V in a DC configuration. The resistors R1 and R2 are for self-biasing.

FIG. 14 illustrates a simplified circuit representing only a main DC configuration part in FIG. 13. As illustrated in FIG. 14, the drain current Idd flows through the FET F2 and the resistor R2, and then flows again as the drain current through the FET F1, to finally flow to the ground after passing through the resistor R1. The gate voltage is fixed to 0V with the resistor R3, and thus gate bias (gate-source voltage) of the FET F1 is negatively self-biased with R1·Idd obtained by multiplying the resistor R1 and the current Idd. Similarly, the gate-source potential of the FET F2 is also negatively self-biased with R2·Idd obtained by multiplying the resistor R2 by the current Idd.

This current reuse circuit configuration earned its name from the structure described above in which the current Idd flows through the FET F2 and then again flows through the FET F1. The FETs F1 and F2, in charge of amplification, have their sources grounded with the capacitors C1 and C2, for the RF signal. Thus, the configuration is equivalent to a source grounded two-stage amplifier for an RF signal. Still, the current Idd commonly flows through both FETs, and thus is the only current consumed from the power supply Vdd.

In a general source grounded two-stage amplifier, power supply voltage Vdd/2 is applied to the drain terminal for each of the FETs F1 and F2. Here, when the current Idd flows in the FETs F1 and F2, current 2·Idd, which is double the current consumed in the current reuse circuit, is consumed from the power supply voltage Vdd/2. All things considered, the current consumption can be reduced with the current reuse circuit, in a battery driven product with a usually limited current capacity.

The current reuse circuit has a feature even more suitable for the on-vehicle radar, compared with the current consumption reducing effect. The feature relates to a withstand voltage constraint of the GaAs-based FET. In many cases, the withstand voltage of FETs, usable in millimeter wave bands, is not higher than 4 V due to its short gate length that is no longer than 0.2 µm. Thus, in many cases, standard power supply voltage in a vehicle, which is 5 V, cannot be directly applied. When the current reuse circuit illustrated in FIGS. 13 and 14 is used, the voltage applied to each FET is 2.5 V which is half the standard power supply voltage 5 V and is small enough for the withstand voltage 4V. Thus, the power supply voltage 5 V can be applied to the power supply of the amplifier.

The GaAs-based FET is generally a depletion mode FET, which is generally more difficult to achieve a bias circuit with constant drain current supply despite process variations compared with enhancement mode CMOS and bipolar devices. For example, a current reuse circuit described in 2005 IEEE Journal of Solid-State Circuits, pp. 1288-1295, "A 1.8-V Operation 5-GHz-Band CMOS Frequency Doubler Using Current-Reuse Circuit Design Technique" is an enhancement mode nMOS, and thus can achieve a current mirror bias circuit less affected by the process variation.

FIG. 15 illustrates a result of simulating a variation of the drain current Idd, in the circuit illustrated in FIG. 14, due to a variation of saturation drain current Idss (in an FET when gate-source voltage is 0 V). The drain current Idd in the circuit largely changes as the saturation drain current Idss increases. This trend is more prominent with smaller values of resistors R1 and R2.

SUMMARY OF THE INVENTION

When millimeter bands are used, to achieve the highest possible gain of the FET, the values, obtained by multiplication such as a resistor R1·Idd and a resistor R2·Idd (that is, self-biasing voltage), are set to the voltage (for example, −0.05 V to −0.15 V) slightly lower than the gate voltage 0 V. Thus, the values of the resistors R1 and R2 are small, resulting in the large current variation. A large variation of the bias current leads to a large variation of gain characteristics of an amplifier, reduction of which has been desired. There have been reports on bias circuits using a negative power supply to reduce the variation of the saturation drain current Idss. Still, a bias circuit operable with a single positive power supply, as a subject of the present application, has been desired.

The features and advantages of the present invention may be summarized as follows.

According to one aspect of the present invention, a current reuse field effect transistor amplifier includes a first field effect transistor including a first gate to which a radio frequency (RF) signal is input, a first source, and a first drain, a first resistor connected between the first source and a terminal for grounding, a second field effect transistor including a second source, a second gate connected to the first drain, and a second drain that is connected to a terminal for power supply and outputs the RF signal, a second resistor connected between the second source and the second gate, a third field effect transistor including a third source, a third drain connected to the terminal for power supply, and a third gate connected to the terminal for grounding, a fourth field effect transistor including a fourth source, a fourth drain, and a fourth gate connected to the third source, one or a plurality of diodes connected in series between the fourth source and the terminal for grounding, a third resistor connected between the terminal for power supply and the fourth drain, and a fourth resistor connected between the fourth drain and the first gate, wherein the first to the fourth field effect transistors are each a depletion mode field effect transistor.

Other and further objects, features and advantages of the invention will appear more fully from the following description.

DETAILED DESCRIPTION OF THE PREFERRED EMBODIMENTS

Figure 1:
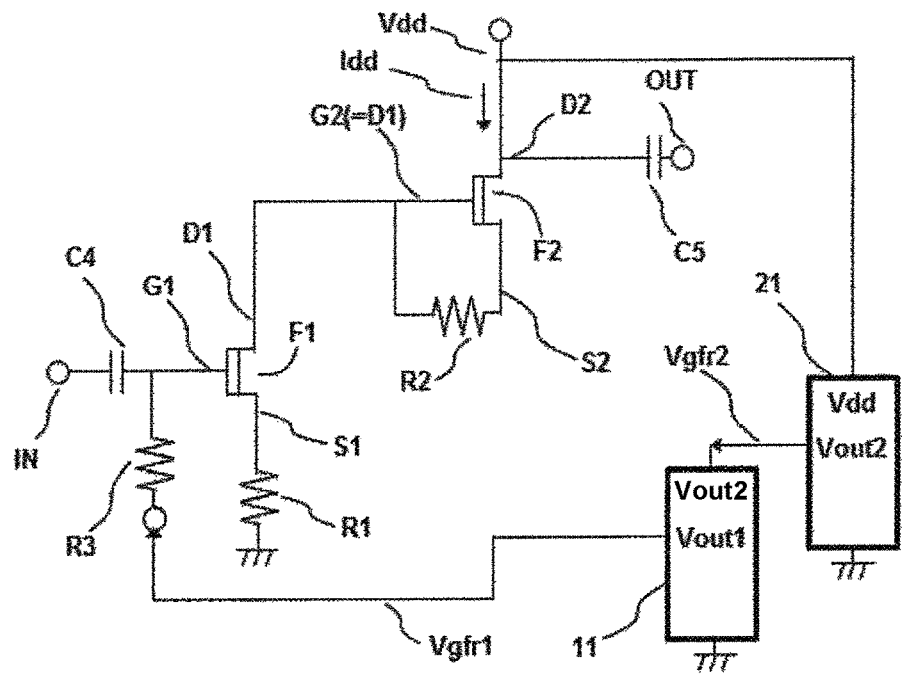
FIG. 1 illustrates a circuit configuration of an amplifier unit of a current reuse FET amplifier according to Embodiment 1.

A current reuse FET amplifier according to an embodiment of the present invention is described with reference to the drawings. The same or corresponding components are denoted with the same reference numeral in the drawings, including the ones that have already been described, and the redundant description may be omitted as appropriate. The description below is given with a GaAs-based depletion mode FET (including an HEMT) described as an example.

First Embodiment (Description on Configuration)

Figure 2:
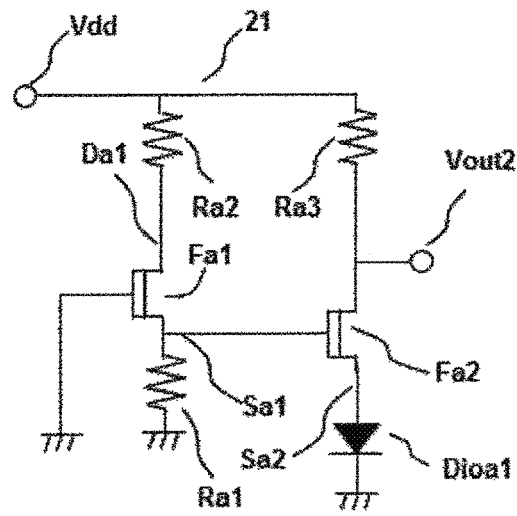
FIG. 2 illustrates a configuration of control circuit of an amplifier unit of a current reuse FET amplifier according to Embodiment 1.
Figure 3:
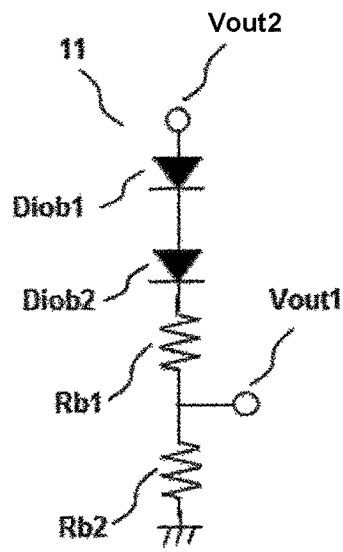
FIG. 3 illustrates a configuration of control circuit of an amplifier unit of a current reuse FET amplifier according to Embodiment 1.
Figure 14:
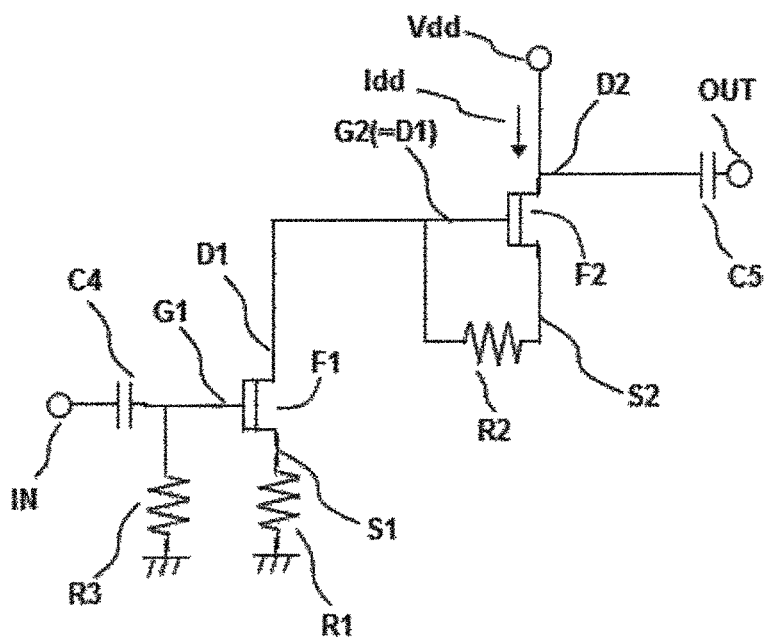
FIG. 14 illustrates a DC configuration part of a power reuse amplifier for the purpose of comparison.

FIG. 1 illustrates a circuit configuration of an amplifier unit of a current reuse FET amplifier according to Embodiment 1 of the present invention. In the figure, only the elements related to a DC configuration are illustrated as in FIG. 14. FIGS. 2 and 3 illustrate circuit configurations of control circuits 11 and 21. In FIG. 1, an FET F1 includes a drain D1, a gate G1, and a source S1, and an FET F2 includes a drain D2, a gate G2, and a source S2. Node voltage Vgfr1 and node voltage Vgfr2 are respectively the same in potential as output voltage Vout1 and output voltage Vout2 output by the control circuits 11 and 21. In FIGS. 1 to 3, the control circuit 21 outputs the output voltage Vout2 (=Vgfr2) in accordance with variation of saturation current Idss of the FET, and the control circuit 11 outputs the output voltage Vout1 (=Vgfr1) obtained by shifting the level of the output voltage Vout2.

As illustrated in FIG. 1, the FET F1 includes a resistor R1 as a source load and the drain D1 is connected to the gate G2 of the FET F2. The FET F2 includes a resistor R2 as a source load. Current Idd through the FETs F1 and F2 is determined based on self-bias achieved by the resistors R1 and R2. The current Idd commonly flows through the FETs F1 and F2, whereby a current reuse circuit is formed. An RF signal input through an input terminal IN is amplified by the FET F1, then is amplified by the FET F2, and is output from the output terminal OUT of the FET F2 through the drain D2, whereby a current reuse FET amplifier is formed. The gate G1 of the FET F1 is connected to the output voltage Vout1 of the control circuit 11.

In the control circuit 21 illustrated in FIG. 2, an FET Fa1 has a gate grounded, and includes a resistor Ra1 as a source load and a resistor Ra2 as a drain load. An FET Fa2 has a gate connected to a source of the FET Fa1, and includes a diode Dioa1 as a source load and a resistor Ra3 as a drain load. The output voltage Vout2 is output out from the drain of the FET Fa2. The resistors Ra2 and Ra3 as the drain loads are connected to power supply voltage Vdd. The FET Fa1 has drain potential Da1 and source potential Sa1. The FET Fa2 has source potential Sa2. When the power supply voltage is low and thus does not overwhelm the withstand voltage of the FETs, the resistor R2 may be omitted.

In the control circuit 11 in FIG. 3, the output voltage Vout1 is output after passing through two diodes Diob1 and Diob2, and then subjected to voltage dividing by resistors Rb1 and Rb2, in a direction from a terminal for the power supply voltage Vdd to the ground. Here, the FET is assumed to be a GaAs-based FET, and the diodes in FIGS. 2 and 3 are assumed to be a GaAs-based Schottky junction diode that can be manufactured through the same process as the FET. Still, an equivalent operation can be expected with a pn junction diode.

(Description on Operation)

A variation of drain current Idd in FIG. 1 with respect to a variation of saturation current Idss of the FET due to a process variation can be reduced as much as possible through the following operations. Specifically, voltage of the gate G1 of the FET is lowered when the saturation current Idss exceeds a predetermined value, and the voltage of the gate G1 of the FET is raised when the saturation current Idss falls below a predetermined value.

Figure 4:
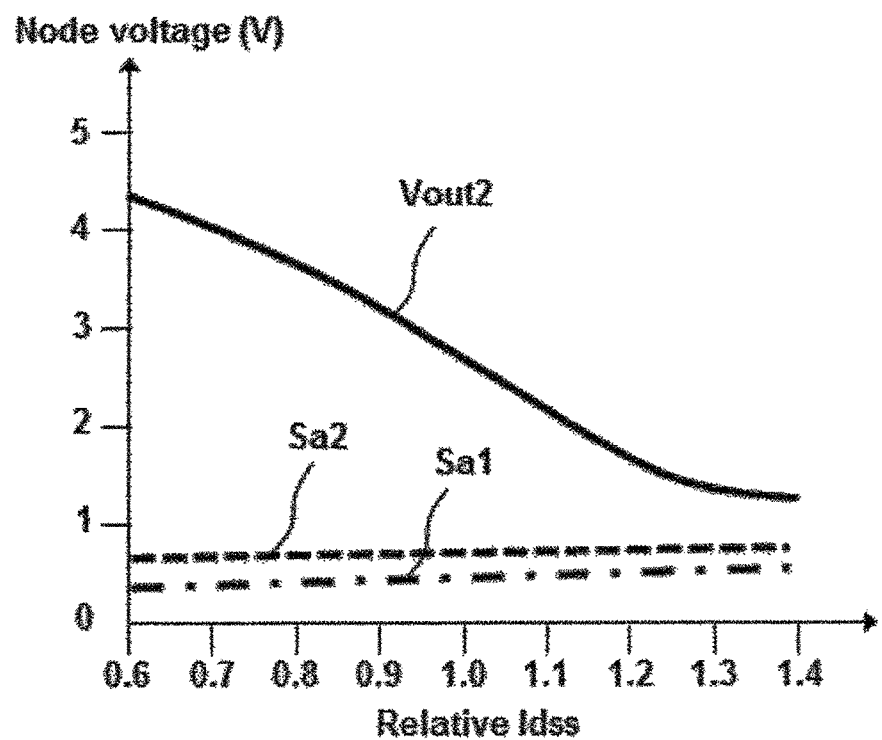
FIG. 4 illustrates a result of simulation of the control circuit according to Embodiment 1.

A variation of the source potential Sa2 of the FET Fa2 of the control circuit 21 is regulated by the diode Dioa1 as the source load, to be small relative to the variation of the source current of the FET Fa2. A plurality of the diodes Dioa1 may be connected in series depending on threshold voltage of the FET Fa2. One the other hand, the FET Fa1 has the resistor Ra1 as the source load, and thus has the source potential Sa1 increasing along the saturation current Idss. Thus, gate-source voltage (Sa1-Sa2) of the FET Fa2 increases along the saturation current Idss, and drain current of the FET Fa2 also increases. All things considered, the output voltage Vout2 decreases as the voltage drop of the resistor Ra3 as the drain load increases. FIG. 4 illustrates a result of simulating the output voltage Vout2 of the control circuit 21 as well as the source potential Sa1 and the source potential Sat relative to the variation of saturation current Idss. The voltage variation described above can be seen in the figure.

Figure 5:
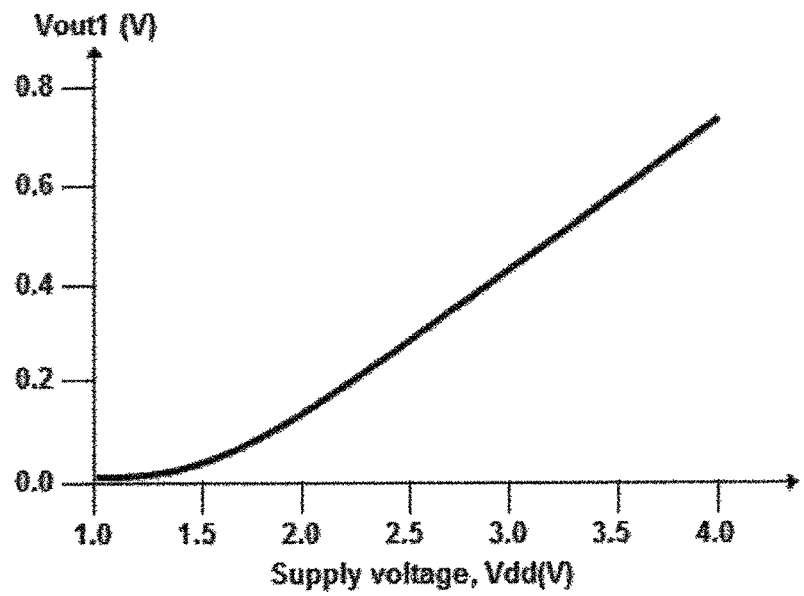
FIG. 5 illustrates a result of simulation of the control circuit according to Embodiment 1.

The output voltage Vout1 of the control circuit 11 is output after passing through the diodes Diob1 and Diob2 and then subjected to the voltage dividing by the resistors, and thus can be lowered by lowering the power supply voltage Vdd, when the saturation current Idss is large. FIG. 5 illustrates a result of simulating the output voltage Vout1 relative to the variation of the power supply voltage Vdd. The output voltage Vout1 drops as the power source supply voltage Vdd decreases, whereby the level shifting function described above can be achieved.

Figure 6:
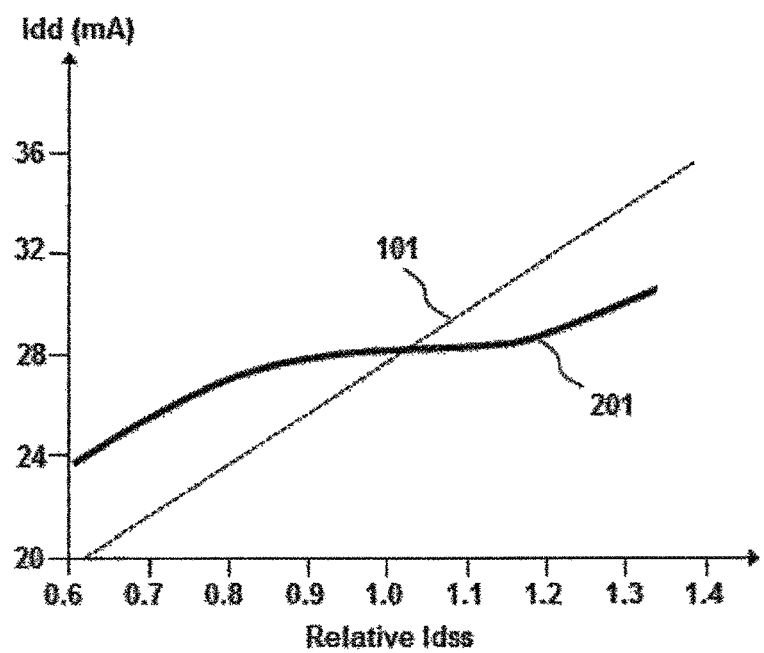
FIG. 6 illustrates a result of simulating the variation of the drain current relative to the variation of the saturation current of the FET according to Embodiment 1.

As described above, the output voltage Vout2 drops as the saturation current Idss increases, and the output voltage Vout1 of the control circuit 11, using the output voltage Vout2 as the power supply, also drops as the saturation current Idss increases. Thus, the variation of the current Idd can be reduced with the output voltage Vout1 applied to the gate G1 of the FET F1. FIG. 6 illustrates a result of simulating the variation of the drain current Idd relative to the variation of the saturation current Idss of the FET in the FIG. 1. A characteristic line 201 represents drain current according to Embodiment 1, and a characteristic line 101 represents a comparative example of drain current corresponding to FIG. 14. It can be seen in the figure that the variation of the drain current Idd, relative to the saturation current Idss as a reference, can be more effectively reduced in a range from the decrease of 30% to increase of 40%.

The control circuits 11 and 21 added to the amplifier unit involves an increase in current consumption. In the simulation according to Embodiment 1, the incremented amount is about one sixth of the consumed current of the amplifier unit. In the on-vehicle radar power amplifier, the number of installed stages of the amplifier units illustrated in FIG. 1 is three to six in many cases. The control circuit unit can be shared among the amplifier units and thus does not largely contribute to the increase in the consumed current in the actual operation.

As described above, in the control circuit of the current reuse FET amplifier, the source potential Sa1 of the gate grounded FET Fa1, including the resistor Ra1 as the source load, increases and decreases along the saturation current Idss. Based on this mechanism, the output voltage Vout2 that increases and decreases as the saturation current Idss decreases and increases, can be output through the drain D2, with the source potential Sa1 applied to the gate G2 of the FET Fa2 including the diode and resistor respectively serving as source and drain loads. The feature of the embodiment is that the output voltage Vout2 is applied to the gate G1 of the FET Fa1, in the amplifier unit at the initial stage, after having its level shifted as appropriate, so that the variation of the current Idd relative to the saturation current Idss can be reduced easily. A further feature of the embodiment is that the configuration can be achieved with a single positive power supply, and without using a negative power supply.

(Advantageous Effect of First Embodiment)

As described above, the current reuse FET amplifier according to Embodiment 1 has an advantageous effect of being capable of reducing the variation in drain current relative to a process variation of the saturation current Idss of the depletion mode FET, and also has an advantageous effect of being implementable with a single positive power supply.

Second Embodiment (Description on Configuration)

Figure 7:
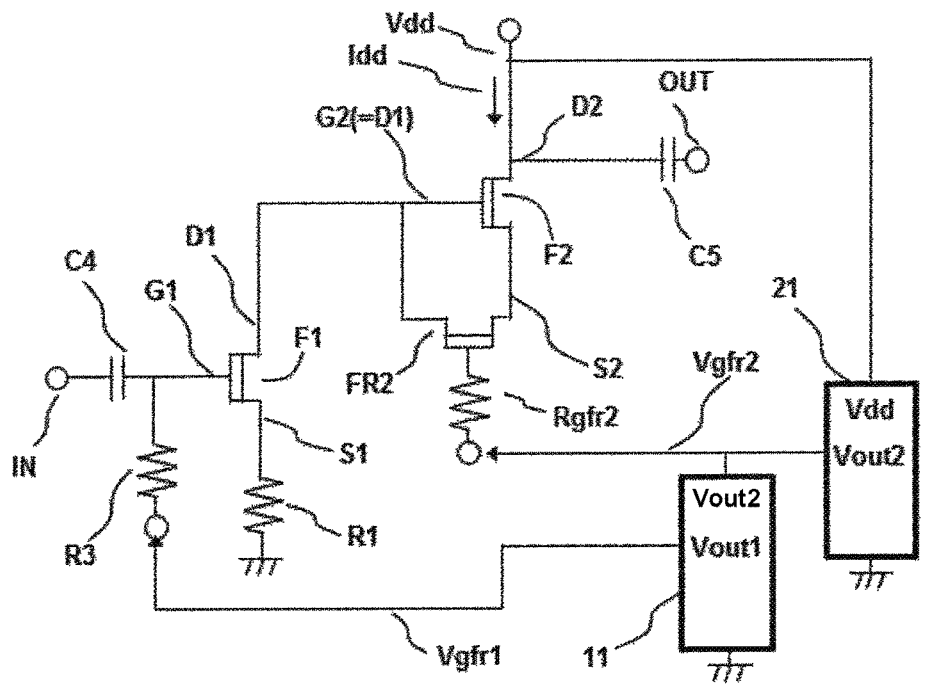
FIG. 7 illustrates a circuit configuration of a current reuse FET amplifier according to Embodiment 2.

FIG. 7 illustrates an example of a current reuse FET amplifier according to Embodiment 2 of the present invention as a modification of Embodiment 1. FIG. 7 is different from FIG. 1 in Embodiment 1 in that the resistor R2 as the source load of the FET F2 is replaced with an FET FR2, and the output voltage Vout2 of the control circuit 21 is applied to a gate of the FET FR2 through a resistor Rfgr2. The FET FR2 has the drain and the source respectively connected to the source S2 and the gate G2 (=D1 of the FET F2, and thus serves as a variable resistor.

(Description on Operation)

The gate voltage of the FET FR2, serving as the variable resistor, is controlled with the output voltage Vout2 of the control circuit 21. For example, the output voltage Vout2 drops when the saturation current Idss increases. When this happens, the gate-source voltage of the FET FR2 drops, and thus an ON resistance of the FET FR2 increases. The increase in the ON resistance results in negative increase of the self-bias voltage of the FET F2, whereby the current Idd is prevented from increasing. The gate G1 of the FET F1 is controlled with the output voltage Vout1 of the control circuit 11 as in Embodiment 1. Thus, the variation of the current Idd can be reduced also by controlling this route.

Figure 8:
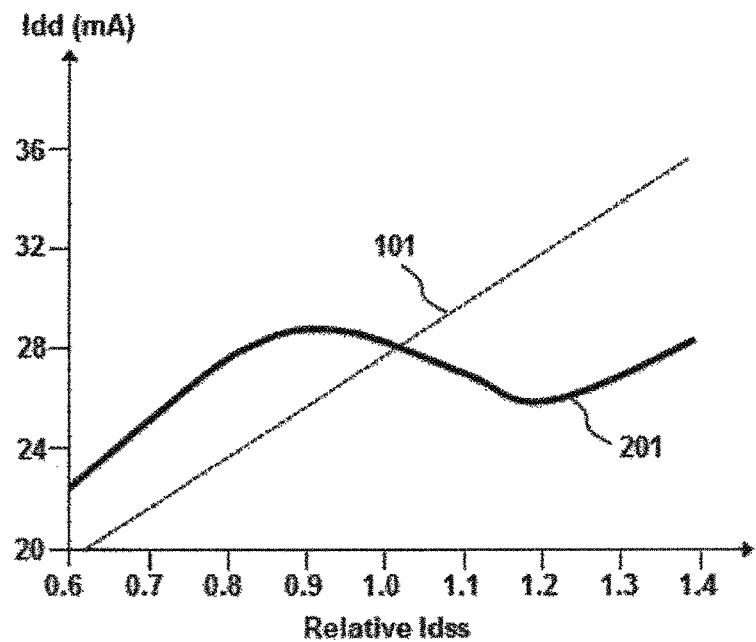
FIG. 8 illustrates a result of simulating a variation of the drain current relative to the variation of the saturation current in the circuit according to Embodiment 2.

FIG. 8 illustrates a result of simulating a variation of the drain current Idd relative to the variation of the saturation current Idss in the circuit illustrated in FIG. 7. It can be seen in the figure that the variation of the drain current Idd (201) can be more reduced relative to the comparative example 101 (characteristic line in FIG. 14), in a range from 40% decrease to 40% increase of the variation of the saturation current Idss.

(Description on Advantageous Effect)

The resistor R2 is replaced with the FET FR2 as the variable resistor, whereby the current Idd is less affected by the process variation of the resistance value, compared with Embodiment 1. Furthermore, as in Embodiment 1, the advantageous effects that the current Idd is less affected by the process variation of the saturation current Idss and that the configuration can be achieved with a single positive power supply operation, can be achieved.

Third Embodiment (Description on Configuration)

As described above with reference to the advantageous effect of Embodiment 2, the variation of the current Idd of the current reuse FET amplifier, illustrated in FIG. 1, is not only affected by the process variation of the saturation current Idss of the FET, but is also affected by the process variation of the resistance value. In particular, this technique is directed to a case where the self-bias voltage is low (for example, −0.05 V to −0.15V) and thus the resistance value is small so that the current Idd is largely affected. The current Idd can be effectively made less affected by the process variation of the resistance value, with the resistors R1 and R2, illustrated in FIG. 1, with low resistances omitted. A circuit structure of a current reuse FET amplifier in FIG. 9 according to Embodiment 3 is made to achieve this structure.

Figure 9:
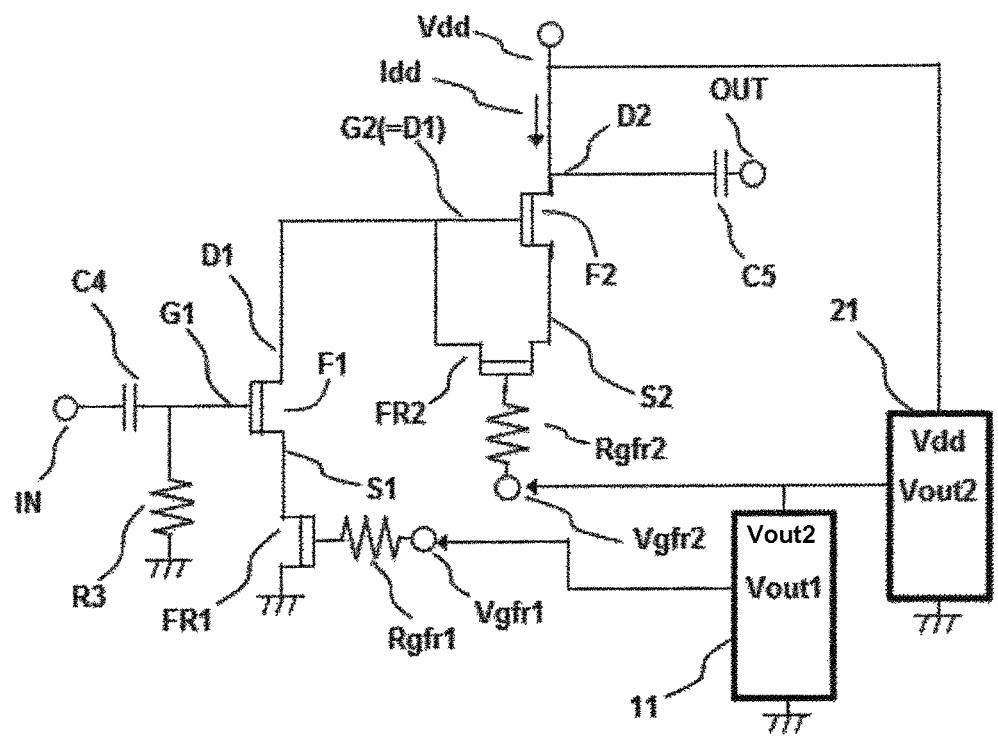
FIG. 9 illustrates a circuit configuration of an amplifier unit of a current reuse FET amplifier according to Embodiment 3.

FIG. 9 is different from FIG. 1 in that: the resistors R1 and R2 are replaced with FETs FR1 and FR2 serving as variable resistors; the gate G1 of the FET F1 is grounded through a resistor R3 in the DC configuration; the gate of the FET FR1 is controlled with the output voltage Vout1 of the control circuit 11 through a resistor Rgfr1; and the gate of the FET FR2 is controlled with the output voltage Vout2 of the control circuit 21 through a resistor Rgfr2. As illustrated in FIG. 9, the FET FR1 has the drain connected to the source S1 of the FET F1 and the source grounded. The FET FR2 has the drain connected to the source S2 of the FET F2 and the source connected to the gate G2 (=D1) of the FET F2.

(Description on Operation)

As described above in Embodiment 2, the variation of the current Idd relative to the process variation of the saturation current Idss can be reduced by lowering and raising the gate voltage of the FETs FR1 and FR2, serving as variable resistors, respectively when the saturation current Idss increases and decreases. The control circuit 21 described in Embodiment 1 lowers or raises the output voltage Vout2 when the saturation current Idss increases/decreases, and thus can be used for controlling the gate voltage of the FETs FR1 and FR2. The level difference between the FETs FR1 and FR2 in the gate voltage can be offset with the level shifting function of the control circuit 11.

Figure 10:
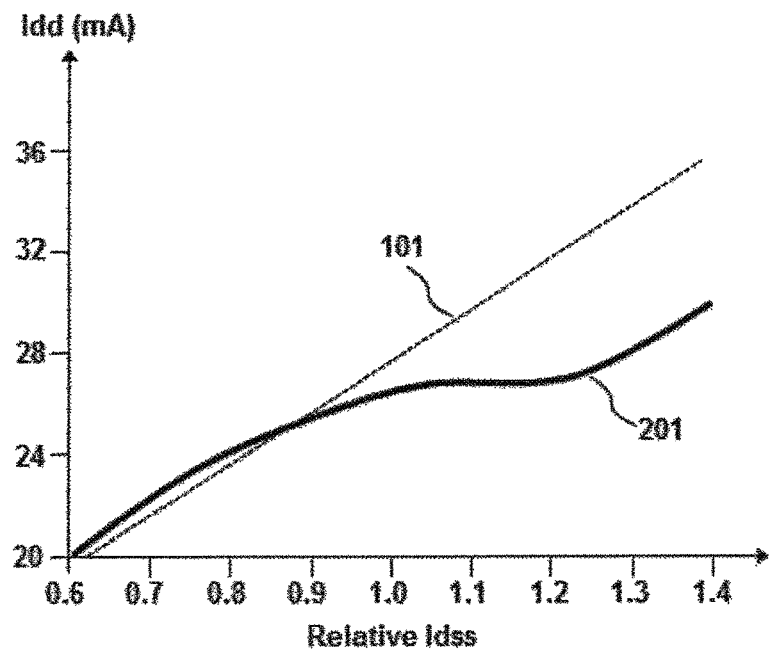
FIG. 10 illustrates a result of simulating a variation of the drain current relative to the variation of the saturation current in the circuit according to Embodiment 3.
Figure 15:
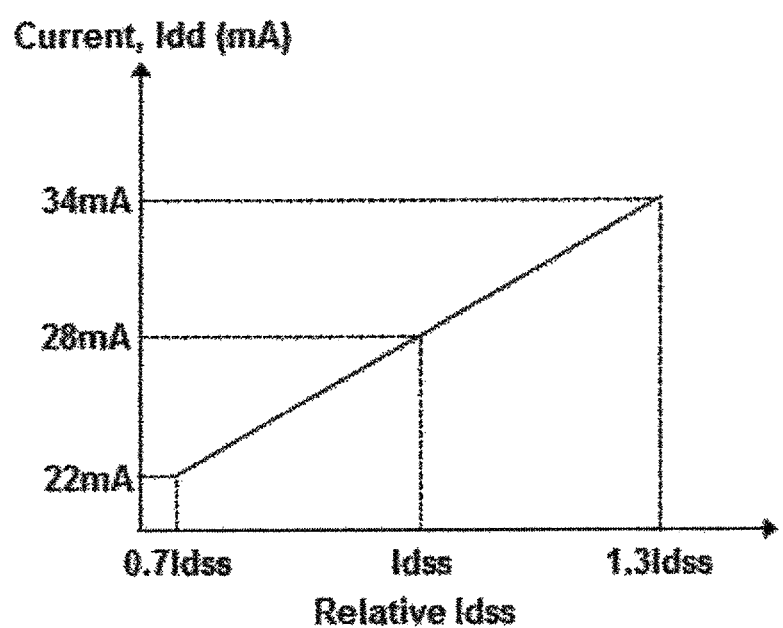
FIG. 15 illustrates a result of simulating a variation of the drain current relative to the variation of the saturation current in the circuit provided for the purpose of comparison.

FIG. 10 illustrates a result of simulating the variation of the current Idd in FIG. 9 relative to the variation of the saturation current Idss of the FET. The characteristic line 201 represents the drain current according to Embodiment 3, and the characteristic line 101 represents a comparative example of drain current corresponding to FIG. 15. It can be seen in the figure that the variation of the drain current Idd relative to the saturation current Idss, serving as a reference, can be more effectively reduced in a range from decrease of 30% to increase of 40%.

(Description on Advantageous Effect)

The resistors R1 and R2 are replaced with the FETs as the variable resistor. Thus, in principle, the current Idd can be less affected by the process variation of the resistance value, compared with Embodiments 1 and 2. Furthermore, as in Embodiment 1, the advantageous effects that the current Idd is less affected by the process variation of the saturation current Idss and that the configuration can be achieved with a single positive power supply operation, can be achieved.

Fourth Embodiment

Figure 11:
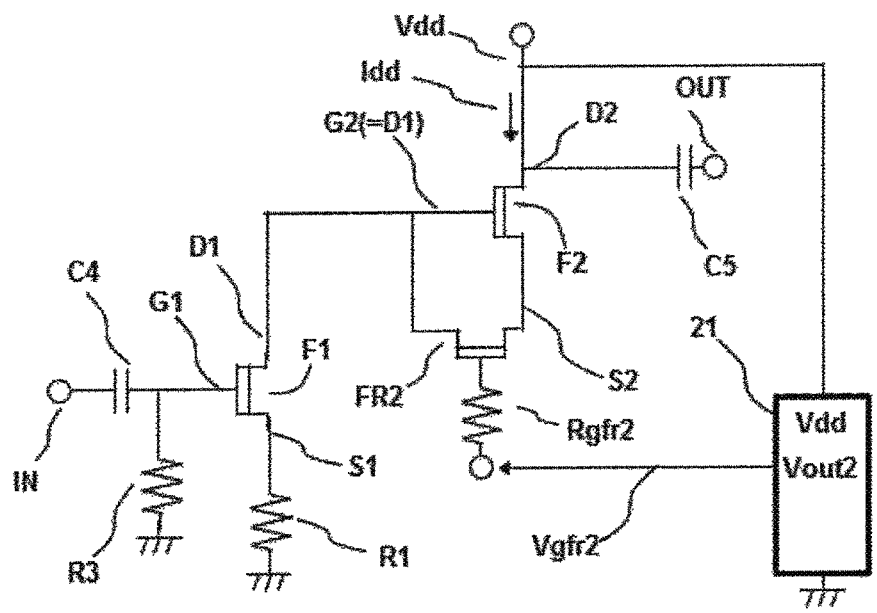
FIG. 11 illustrates a circuit configuration of an amplifier unit of a current reuse FET amplifier according to Embodiment 4.

FIG. 11 illustrates an example of a current reuse FET amplifier according to Embodiment 4 of the present invention, which is a modification of Embodiment 3. FIG. 11 is different from FIG. 9 in Embodiment 3 in that the FET FR1 as the source load of the FET F1 is replaced with the resistor R1, and in that the control circuit 11 and the resistor Rfgr1 are omitted.

Through the simulation that is the same as that of FIG. 10, a result (not illustrated) that is the same as that illustrated in FIG. 10 is obtained in a range from decrease of 20% to increase of 20% of the variation of the saturation current Idss. In many cases, the variation of the saturation current Idss due to the process variation is usually managed to be within the range. Thus, an advantageous effect of limiting the variation of the drain current Idd to be within the applicable range for the actual use can be achieved. The control circuit is omitted and the FET FR1 is replaced with the resistor R1 as described above. Thus, an advantageous effect of achieving a smaller circuit area compared with Embodiment 3 can be achieved. The advantageous effect that the configuration can be achieved with a single positive power supply operation can be achieved as in Embodiment 3. Still, the current Idd is more affected by the process variation of the resistance value compared with Embodiment 3, because the resistor R1 is used.

Fifth Embodiment

Figure 12:
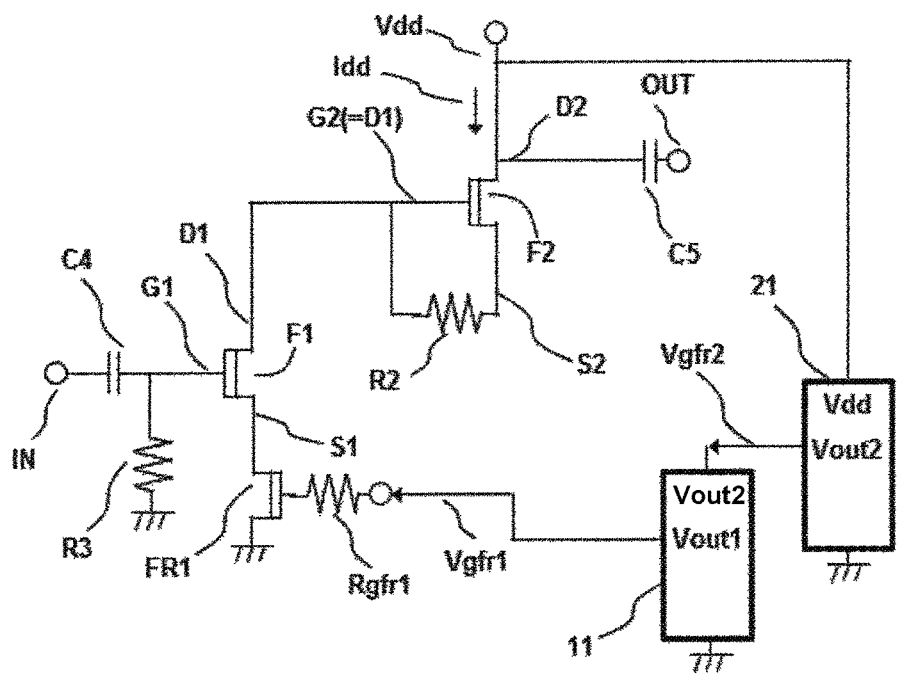
FIG. 12 illustrates a circuit configuration of an amplifier unit of a current reuse FET amplifier according to Embodiment 5.
Figure 13:
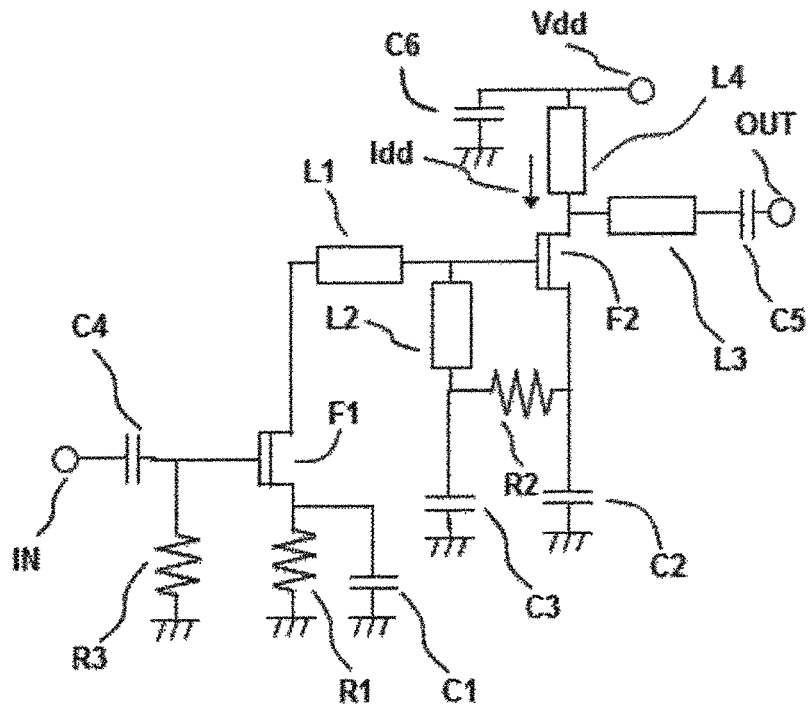
FIG. 13 illustrates a circuit configuration of a power reuse amplifier for the purpose of comparison.

FIG. 12 illustrates an example of a current reuse FET amplifier according to a fifth embodiment of the present invention, which is another modification of Embodiment 3. FIG. 12 is different from FIG. 9 in Embodiment 3 in that the source load of the FET F2 is changed from the FET FR2, serving as the variable resistor, to the register R2, and the resistor Rgfr2 is omitted.

Through the simulation that is the same as that of FIG. 10, a result (not illustrated) that is the same as that illustrated in FIG. 10 is obtained in a range from decrease of 20% to increase of 20% of the variation of the saturation current Idss. As described in Embodiment 4, in many cases, the variation of the saturation current Idss due to the process variation is usually managed to be within the range. Thus, an advantageous effect of limiting the variation of the drain current Idd to be within the applicable range for the actual use can be achieved. The element FET FR2 is omitted. Thus, an advantageous effect of achieving a smaller circuit area compared with Embodiment 3 can be achieved. The advantageous effect that the configuration can be achieved with a single positive power supply operation can be achieved as in Embodiment 1. Still, the current Idd is more affected by the process variation of the resistance value compared with Embodiment 3, because the resistor R2 is used as in Embodiment 4.

The embodiments are described above with the GaAs-based depletion mode FET (including the HEMT) as an example. It is to be noted that an InP-based, GaN-based, or Si depletion mode FET can achieve the same advantageous effects, as long as the depletion mode FET is an n-channel depletion mode FET.

A current reuse FET amplifier according to the present invention provides an effect of reducing a variation of bias current of the amplifier, with gate voltage or a resistor for self-biasing of an FET of the amplifier changing in accordance with a process variation of saturation current Idss of the FET.

Obviously many modifications and variations of the present invention are possible in the light of the above teachings. It is therefore to be understood that within the scope of the appended claims the invention may be practiced otherwise than as specifically described.

What is claimed is:

1. A current reuse field effect transistor amplifier comprising:
a first field effect transistor including a first gate to which a radio frequency (RF) signal is input, a first source, and a first drain;
a first resistor connected between the first source and a terminal for grounding;
a second field effect transistor including a second source, a second gate connected to the first drain, and a second drain that is connected to a terminal for power supply and outputs the RF signal;
a second resistor connected between the second source and the second gate;
a third field effect transistor including a third source, a third drain connected to the terminal for power supply, and a third gate connected to the terminal for grounding;
a fourth field effect transistor including a fourth source, a fourth drain, and a fourth gate connected to the third source;
one or a plurality of diodes connected in series between the fourth source and the terminal for grounding;
a third resistor connected between the terminal for power supply and the fourth drain; and
a fourth resistor connected between the fourth drain and the first gate,
wherein
the first to the fourth field effect transistors are each a depletion mode field effect transistor.

2. A current reuse field effect transistor amplifier comprising:
a first field effect transistor including a first gate to which a radio frequency (RF) signal is input, a first source, and a first drain;
a first resistor connected between the first source and a terminal for grounding;
a second field effect transistor including a second source, a second gate connected to the first drain, and a second drain that is connected to a terminal for power supply and outputs the RF signal;
a third field effect transistor including a third source, a third drain connected to the terminal for power supply, and a third gate connected to the terminal for grounding;
a fourth field effect transistor including a fourth source, a fourth drain, and a fourth gate connected to the third source;
one or a plurality of diodes connected in series between the fourth source and the terminal for grounding;
a second resistor connected between the terminal for power supply and the fourth drain;
a third resistor connected between the fourth drain and the first gate; and
a fifth field effect transistor including a fifth gate connected to the fourth drain, a fifth drain connected to the second source, and a fifth source connected to the second gate,
wherein the first to the fourth field effect transistors are each a depletion mode field effect transistor.

3. The current reuse field effect transistor amplifier according to claim 1, wherein the first to the fourth field effect transistors are each a GaAs-based, an InP-based, and a GaN-based compound semiconductor field effect transistor.

4. A current reuse field effect transistor amplifier comprising:
a first field effect transistor including a first gate to which a radio frequency (RF) signal is input, a first source, and a first drain;
a second field effect transistor including a second source, a second gate connected to the first drain, and a second drain that is connected to a terminal for power supply and outputs the RF signal;
a third field effect transistor including a third source, a third drain connected to the terminal for power supply, and a third gate connected to a terminal for grounding;
a fourth field effect transistor including a fourth source, a fourth drain, and a fourth gate connected to the third source;
one or a plurality of diodes connected in series between the fourth source and the terminal for grounding;
a first resistor connected between the first gate and the terminal for grounding;
a second resistor connected between the terminal for power supply and the third drain;
a fifth field effect transistor including a fifth gate, a fifth drain connected to the first source, and a fifth source connected to the terminal for grounding;
a sixth field effect transistor including a sixth gate, a sixth drain connected to the second source, and a sixth source connected to the second gate;
a third resistor connected between the fourth drain and the fifth gate; and
a fourth resistor connected between the fourth drain and the sixth gate, wherein
the first to the sixth field effect transistors are each a depletion mode field effect transistor.

5. The current reuse field effect transistor amplifier according to claim 4, wherein the first to the sixth field effect transistors are each a GaAs-based, an InP-based, and a GaN-based compound semiconductor field effect transistor.

6. A current reuse field effect transistor amplifier comprising:
a first field effect transistor including a first gate to which a radio frequency (RF) signal is input, a first source, and a first drain;
a second field effect transistor including a second source, a second gate connected to the first drain, and a second drain that is connected to a terminal for power supply and outputs the RF signal;
a third field effect transistor including a third source, a third drain connected to the terminal for power supply, and a third gate connected to a terminal for grounding;
a fourth field effect transistor including a fourth source, a fourth drain, and a fourth gate connected to the third source;
a first resistor connected between the first gate and the terminal for grounding;
a second resistor connected between the terminal for power supply and the third drain;
a fifth field effect transistor including a fifth gate, a fifth drain connected to the second source, and a fifth source connected to the second gate;
a third resistor connected between the fourth drain and the fifth gate;
a fourth resistor connected between the first source and the terminal for grounding, and
wherein the first to the fifth field effect transistors are each a depletion mode field effect transistor.

7. A current reuse field effect transistor amplifier comprising:

a first field effect transistor including a first gate to which a radio frequency (RF) signal is input, a first source, and a first drain;
a second field effect transistor including a second source, a second gate connected to the first drain, and a second drain that is connected to a terminal for power supply and outputs the RF signal;
a third field effect transistor including a third source, a third drain connected to the terminal for power supply, and a third gate connected to a terminal for grounding;
a fourth field effect transistor including a fourth source, a fourth drain, and a fourth gate connected to the third source;
one or a plurality of diodes connected in series between the fourth source and the terminal for grounding;
a first resistor connected between the first gate and the terminal for grounding;
a second resistor connected between the terminal for power supply and the third drain;
a fifth field effect transistor including a fifth gate, a fifth drain connected to the first source, and a fifth source connected to the terminal for grounding;
a third resistor connected between the fourth drain and the fifth gate; and
a fourth resistor connected between the second source and the second gate,
wherein the first to the fifth field effect transistors are each a depletion mode field effect transistor.

\* \* \* \* \*